(12) United States Patent
Yoshii

(10) Patent No.: US 7,679,441 B2
(45) Date of Patent: Mar. 16, 2010

(54) HIGH FREQUENCY POWER AMPLIFIER

(75) Inventor: Yutaka Yoshii, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 79 days.

(21) Appl. No.: 12/181,336

(22) Filed: Jul. 29, 2008

(65) Prior Publication Data
US 2009/0251209 A1 Oct. 8, 2009

(30) Foreign Application Priority Data
Apr. 3, 2008 (JP) ............................. 2008-096944

(51) Int. Cl.
*H03F 1/00* (2006.01)
*H03F 3/04* (2006.01)
(52) U.S. Cl. ...................... 330/151; 330/302
(58) Field of Classification Search .................. 330/51, 330/151, 302–306; 333/32, 174
See application file for complete search history.

(56) References Cited

U.S. PATENT DOCUMENTS 6,169,449 B1  1/2001  Hasegawa
7,102,444 B2  9/2006  Shanjani et al.
7,501,897 B2 *  3/2009  Mori et al. .................. 330/302

FOREIGN PATENT DOCUMENTS

JP  2000-022559 A  1/2000

* cited by examiner

*Primary Examiner*—Robert Pascal
*Assistant Examiner*—Khiem D Nguyen
(74) *Attorney, Agent, or Firm*—Leydig, Voit & Mayer, Ltd.

(57) ABSTRACT

A high frequency power amplifier comprises: an amplifier that amplifies signals received from a first input terminal and outputs amplified signals to an output terminal; a bypass route that connects a second input terminal to the output terminal without passing through the amplifier; a capacitor having a first end connected to the amplifier, and a second end connected to the output terminal; a first switch having a first terminal connected to the second end of the capacitor and to the output terminal, and a second terminal connected to the bypass route; an inductor connected in parallel with the capacitor; a second switch connected in parallel with the capacitor, and connected in series with the inductor; and a control unit that turns off the first switch and the second switch at a high power level and turns on the first switch and the second switch at a low power level.

4 Claims, 3 Drawing Sheets

HIGH FREQUENCY POWER AMPLIFIER

BACKGROUND OF THE INVENTION

1. Field of the Invention

The present invention relates to a high frequency power amplifier that switches between a route passing through the amplifier and a route bypassing the amplifier, specifically relates to a high frequency power amplifier that can reduce passing loss.

2. Background Art

A high frequency power amplifier that switches between a route passing through the amplifier and a route bypassing the amplifier has been proposed (for example, refer to Japanese Patent Laid-Open No. 2000-22559).

SUMMARY OF THE INVENTION

FIG. 5 is a block diagram showing a reference example of a high frequency power amplifier. An amplifier 10 amplifies signals inputted from a first input terminal IN1 and outputs the amplified signals to an output terminal OUT. A bypass route 12 connects a second input terminal IN2 to the output terminal OUT without involving the amplifier 10. The gate of the amplifier 10 is connected to the first input terminal IN1 via an input matching circuit 14, the drain of the amplifier 10 is connected to a power source terminal Vc via an inductor 16, and the source of the amplifier 10 is grounded. One end of a capacitor 34 is connected to the drain of the amplifier 10 via an output matching circuit 18, and the other end of the capacitor 34 is connected to the output terminal OUT. A switch 36 is controlled by a control unit 28 to connect the other end of the capacitor 34 to the output terminal OUT at the high power level, and to connect the bypass route 12 to the output terminal OUT at the low power level.

In the high frequency power amplifier shown in FIG. 5, since the signals outputted from the amplifier 10 at the high power level are outputted to the output terminal OUT via the switch 36, there has been a problem that passing loss occurs in the switch 36. In the circuit of Japanese Patent Laid-Open No. 2000-22559, there has been a problem that passing loss similarly occurs in the circulator present between the amplifier and the output terminal. Since passing loss in the switch 36 or the circulator must be compensated in the amplifier 10, there has been a problem that operating current increases in comparison with a single amplifier having the same output power.

To solve the above-described problems, it is an object of the present invention to provide a high frequency power amplifier that can reduce passing loss.

According to one aspect of the present invention, a high frequency power amplifier comprises: an amplifier that amplifies signals inputted from a first input terminal and outputs the amplified signals to an output terminal; a bypass route that connects a second input terminal to said output terminal without involving said amplifier; a capacitor one of whose ends is connected to said amplifier, and the other of whose ends is connected to said output terminal; a first switch one of whose ends is connected to the other end of said capacitor and to said output terminal, and the other of whose ends is connected to said bypass route; an inductor connected in parallel with said capacitor; a second switch connected in parallel with said capacitor, and connected in series with said inductor; and a control unit that turns off said first switch and said second switch at a high power level and turns on said first switch and said second switch at a low power level.

According to the present invention, passing loss can be reduced.

Other and further objects, features and advantages of the invention will appear more fully from the following description.

DETAILED DESCRIPTION OF THE PREFERRED EMBODIMENTS

First Embodiment

Figure 1:
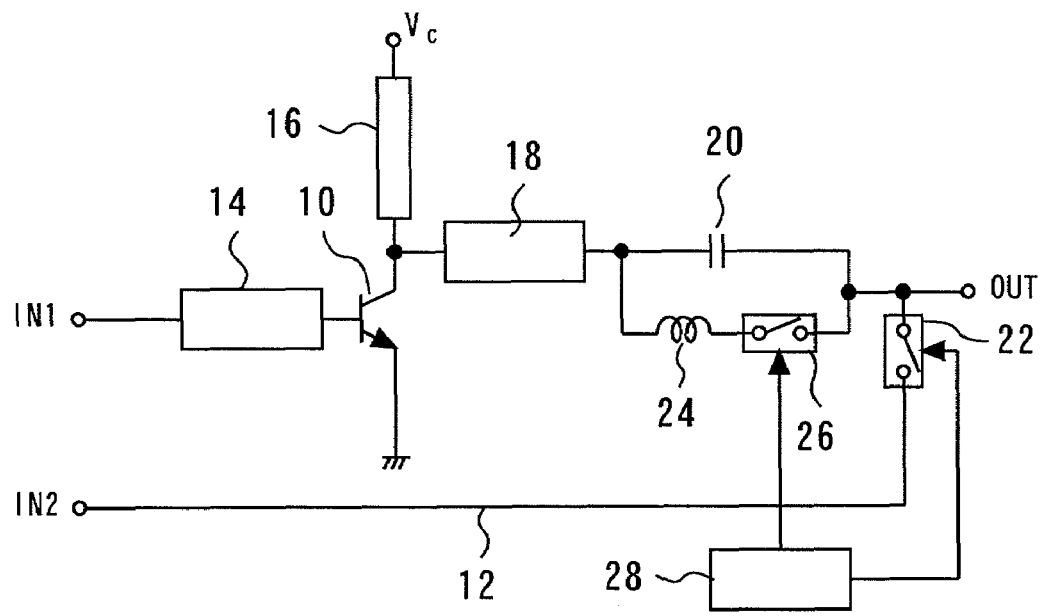
FIG. 1 is a block diagram showing a high frequency power amplifier according to the first embodiment.

FIG. 1 is a block diagram showing a high frequency power amplifier according to the first embodiment. An amplifier 10 amplifies signals inputted from a first input terminal IN1 and outputs the amplified signals to an output terminal OUT. A bypass route 12 connects a second input terminal IN2 to the output terminal OUT without involving the amplifier 10.

The gate of the amplifier 10 is connected to the first input terminal IN1 via an input matching circuit 14, the drain of the amplifier 10 is connected to a power source terminal Vc via an inductor 16, and the source of the amplifier 10 is grounded. One end of a capacitor 20 is connected to the drain of the amplifier 10 via an output matching circuit 18, and the other end of the capacitor 20 is connected to the output terminal OUT.

One end of a first switch 22 is connected to the other end of the capacitor 20 and the output terminal OUT, and the other end of the first switch 22 is connected to the bypass route 12. An inductor 24 is connected in parallel with the capacitor 20. A second switch 26 is connected in parallel with the capacitor 20, and connected in series with the inductor 24. A control unit 28 controls ON/OFF of the first switch 22 and the second switch 26.

The operation of the above-described high frequency power amplifier will be described. At the high power level, the control unit 28 turns the first switch 22 and the second switch 26 off. Since the second switch 26 is thus turned off, passing loss due to the second switch 26 has no effect. Also since the first switch 22 is thus turned off, the bypass route 12 side is isolated from the amplifier 10 side. Therefore, passing loss can be reduced. As a result, the operating current can be suppressed to the same degree as a single amplifier having the same output power. The capacitor 20 operates as a part of the output matching circuit 18.

At the low power level, the control unit 28 turns the first switch 22 and the second switch 26 on. Signals inputted from the second input terminal IN2 is outputted from the output terminal OUT without involving the amplifier 10. At this time, the LC resonant circuit composed of the capacitor 20 and the inductor 24 is resonated by the frequency of the inputted signals, the impedance viewed from the bypass route 12 toward the amplifier 10 is elevated, and the amplifier 10 side is isolated from the bypass route 12 side. As a result, the passing loss of the bypass route 12 can be substantially suppressed to the only passing loss due to the first switch 22.

Second Embodiment

Figure 2:
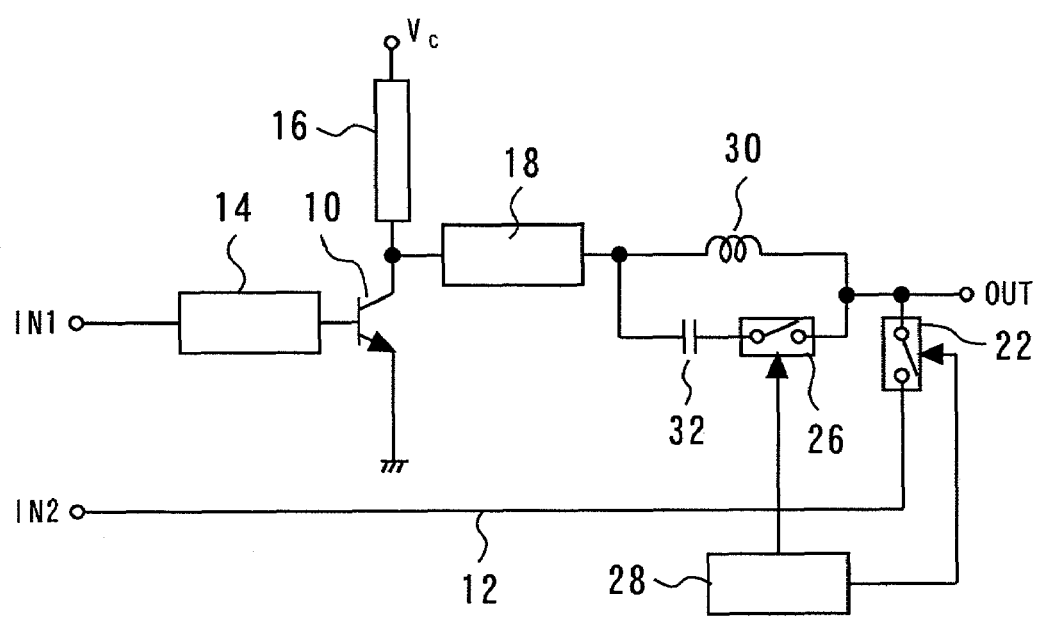
FIG. 2 is a block diagram showing a high frequency power amplifier according to the second embodiment.

FIG. 2 is a block diagram showing a high frequency power amplifier according to the second embodiment. An inductor 30 is provided in place of the capacitor 20 in the first embodiment, and a capacitor 32 is provided in place of the inductor 24 in the first embodiment. Other parts of the configuration are the same as those of the first embodiment. Thereby, advantages equivalent to those from the first embodiment can be obtained.

Third Embodiment

Figure 3:
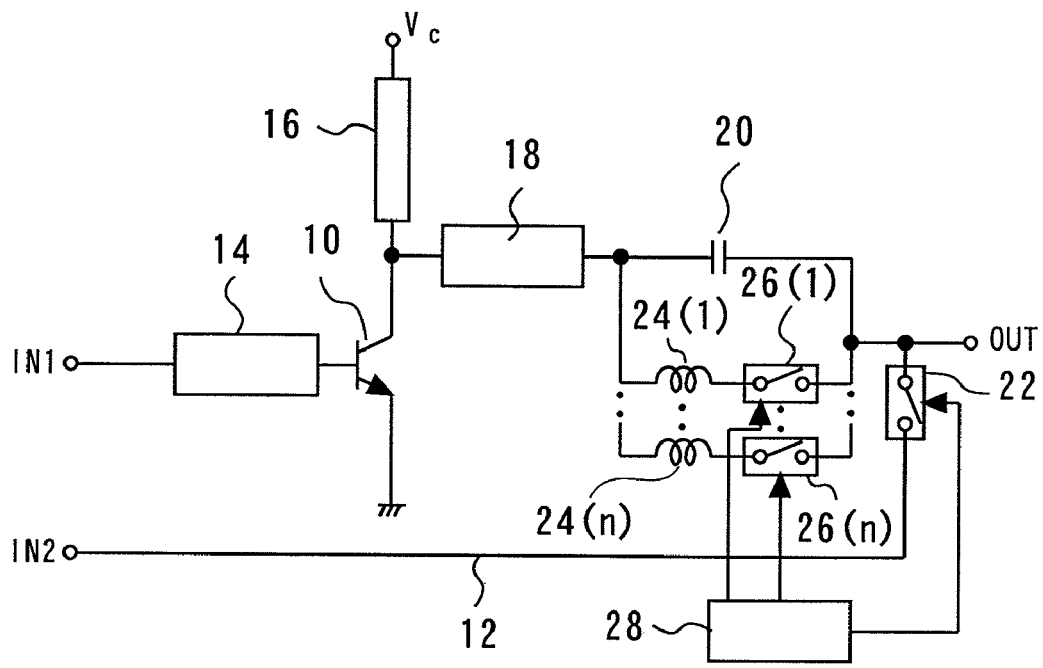
FIG. 3 is a block diagram showing a high frequency power amplifier according to the third embodiment.

FIG. 3 is a block diagram showing a high frequency power amplifier according to the third embodiment. In place of the inductor 24 in the first embodiment, a plurality of inductors 24(1) to 24(n) are connected in parallel with the capacitor 20. In place of the second switch 26 in the first embodiment, a plurality of second switches 26(1) to 26(n) are connected in parallel with the capacitor 20, respectively, and connected in series with the plurality of inductors 24(1) to 24(n), respectively. The control unit 28 turns the first switch 22 and the plurality of second switches 26(1) to 26(n) on at the high power level, and turns the first switch 22 and the plurality of second switches 26(1) to 26(n) off at the low power level. Other parts of the configuration are the same as those of the first embodiment.

When the frequency band of signals inputted from the second input terminal IN2 is wide, the design using a plurality of inductors 24(1) to 24(n) and a plurality of second switches 26(1) to 26(n) so as to overlap their resonant frequencies can reduce passing loss over a wide frequency band.

Fourth Embodiment

Figure 4:
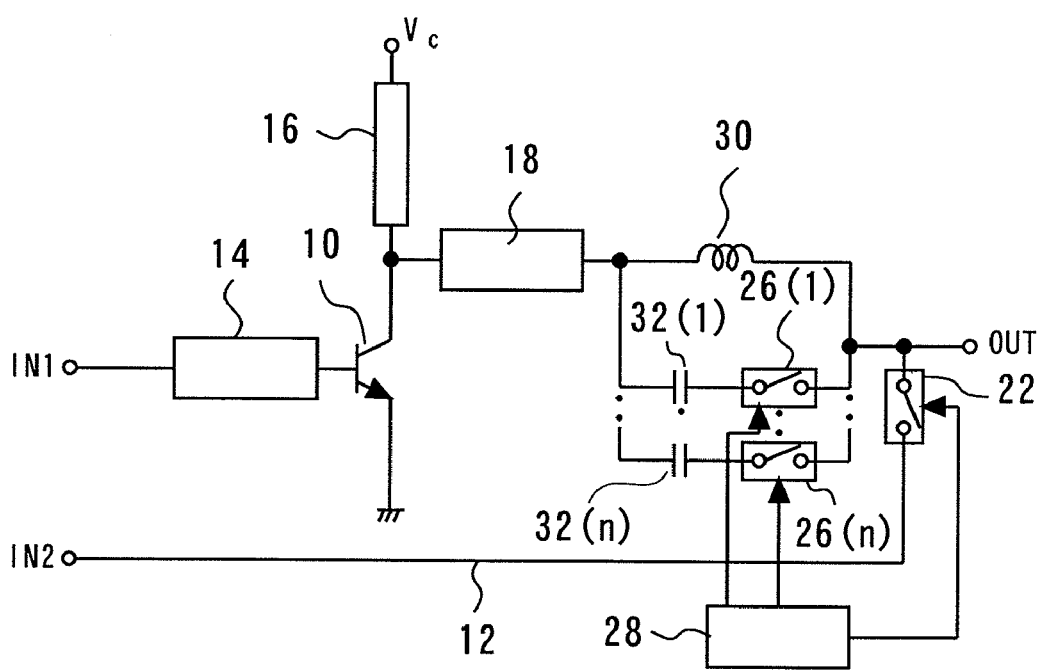
FIG. 4 is a block diagram showing a high frequency power amplifier according to the fourth embodiment.
Figure 5:
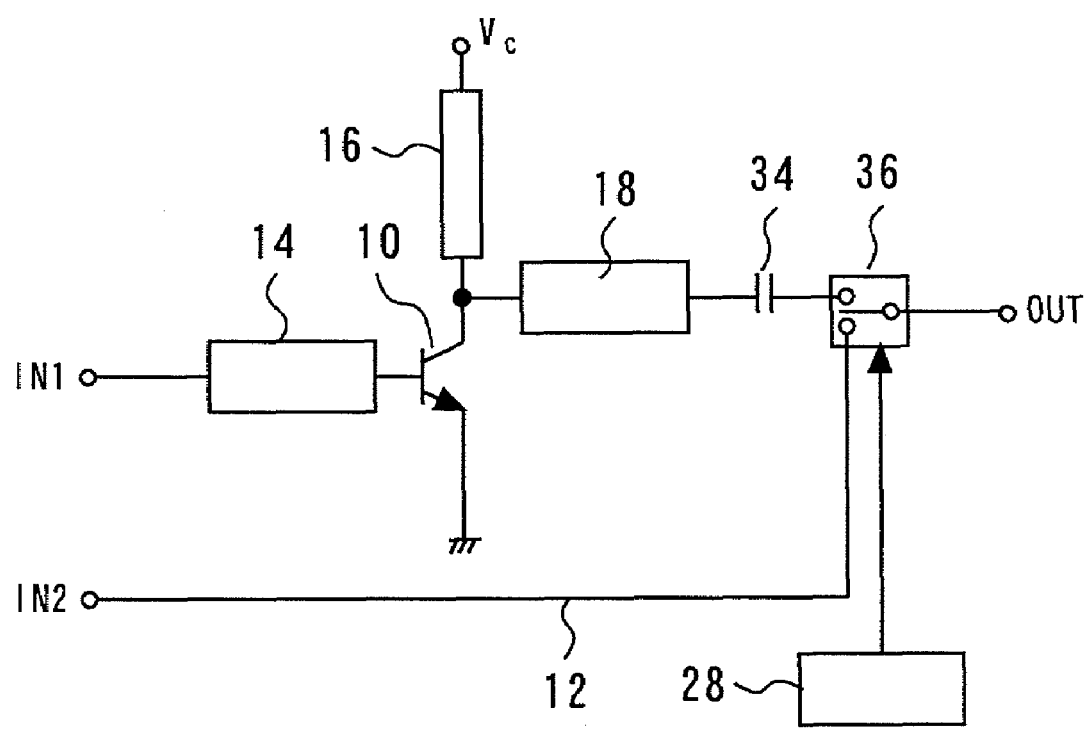
FIG. 5 is a block diagram showing a reference example of a high frequency power amplifier.

FIG. 4 is a block diagram showing a high frequency power amplifier according to the fourth embodiment. In place of the capacitor 32 in the second embodiment, a plurality of capacitors 32(1) to 32(n) are connected in parallel with the inductor 30. In place of the second switch 26 in the second embodiment, each of a plurality of second switches 26(1) to 26(n) is connected in parallel with the inductor 30, and connected in series with each of the plurality of capacitors 32(1) to 32(n). The control unit 28 turns the first switch 22 and the plurality of second switches 26(1) to 26(n) off at the high power level, and turns the first switch 22 and the plurality of second switches 26(1) to 26(n) on at the low power level. Other parts of the configuration are the same as those of the first embodiment. Thereby, advantages equivalent to those from the third embodiment can be obtained.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2008-096944, filed on Apr. 3, 2008 including specification, claims, drawings and summary, on which the Convention priority of the present application is based, are incorporated herein by reference in its entirety.

What is claimed is:

1. A high frequency power amplifier comprising:
   an amplifier that amplifies signals received from a first input terminal and outputs amplified signals to an output terminal;
   a bypass route that connects a second input terminal to said output terminal without passing through said amplifier;
   a capacitor having a first end connected to said amplifier, and a second end connected to said output terminal;
   a first switch having a first terminal connected to the second end of said capacitor and to said output terminal, and a second terminal connected to said bypass route;
   an inductor connected in parallel with said capacitor;
   a second switch connected in parallel with said capacitor, and connected in series with said inductor; and
   a control unit that turns off said first switch and said second switch at a high power level and turns on said first switch and said second switch at a low power level.

2. A high frequency power amplifier comprising:
   an amplifier that amplifies signals received from a first input terminal and outputs amplified signals to an output terminal;
   a bypass route that connects a second input terminal to said output terminal without passing through said amplifier;
   an inductor having a first end connected to said amplifier, and a second end connected to said output terminal;
   a first switch having a first terminal connected to the second end of said inductor and to said output terminal, and a second terminal connected to said bypass route;
   a capacitor connected in parallel with said inductor;
   a second switch connected in parallel with said inductor, and connected in series with said capacitor; and
   a control unit that turns off said first switch and said second switch at a high power level and turns on said first switch and said second switch at a low power level.

3. A high frequency power amplifier comprising:
   an amplifier that amplifies signals received from a first input terminal and outputs amplified signals to an output terminal;
   a bypass route that connects a second input terminal to said output terminal without passing through said amplifier;
   a capacitor having a first end connected to said amplifier, and a second end connected to said output terminal;
   a first switch having a first terminal connected to the second end of said capacitor and to said output terminal, and a second terminal connected to said bypass route;
   a plurality of inductors connected in parallel with said capacitor;
   a plurality of second switches connected in parallel with said capacitor, and connected in series with said plurality of inductors; and
   a control unit that turns off said first switch and said plurality of second switches at a high power level and turns on said first switch and said plurality of second switches at a low power level.

4. A high frequency power amplifier comprising:
   an amplifier that amplifies signals received from a first input terminal and outputs amplified signals to an output terminal;
   a bypass route that connects a second input terminal to said output terminal without passing through said amplifier;
   an inductor having a first end connected to said amplifier, and a second end connected to said output terminal;
   a first switch having a first terminal connected to the second end of said capacitor and to said output terminal, and a second terminal connected to said bypass route;
   a plurality of capacitors connected in parallel with said inductor;
   a plurality of second switches connected in parallel with said inductor, and connected in series with said plurality of capacitors; and
   a control unit that turns off said first switch and said plurality of second switches at a high power level and turns on said first switch and said plurality of second switches at a low power level.

* * * * *